United States Patent [19]
Raad et al.

[11] Patent Number: 5,862,089
[45] Date of Patent: Jan. 19, 1999

[54] METHOD AND MEMORY DEVICE FOR DYNAMIC CELL PLATE SENSING WITH AC EQUILIBRATE

[75] Inventors: George B. Raad; Stephen L. Casper, both of Boise, Id.

[73] Assignee: Micron Technology, Inc., Boise, Id.

[21] Appl. No.: 911,552

[22] Filed: Aug. 14, 1997

[51] Int. Cl.$^6$ .................................................. G11C 7/00
[52] U.S. Cl. ......................... 365/203; 365/205; 365/207
[58] Field of Search ................................... 365/149, 203, 365/205, 207, 190

[56] References Cited

U.S. PATENT DOCUMENTS

| | | | |
|---|---|---|---|
| 4,715,015 | 12/1987 | Mimoto et al. | 365/210 |
| 4,807,195 | 2/1989 | Busch et al. | 365/207 |
| 4,897,568 | 1/1990 | Chern et al. | 307/530 |
| 4,991,142 | 2/1991 | Wang | 365/208 |
| 5,029,136 | 7/1991 | Tran et al. | 365/205 |
| 5,241,496 | 8/1993 | Lowrey et al. | 365/96 |
| 5,241,503 | 8/1993 | Cheng | 365/205 |
| 5,309,392 | 5/1994 | Ootsuka et al. | 365/145 |
| 5,315,555 | 5/1994 | Choi | 365/207 |
| 5,359,566 | 10/1994 | Furuyama | 365/149 |
| 5,367,481 | 11/1994 | Takase et al. | 365/149 |
| 5,636,170 | 6/1997 | Sayyedy | 365/205 |
| 5,680,364 | 10/1997 | Lee | 365/230.05 |
| 5,689,461 | 11/1997 | Kaneko et al. | 365/189.11 |

*Primary Examiner*—Vu A. Le
*Attorney, Agent, or Firm*—Schwegman, Lundberg, Woessner & Kluth, P.A.

[57] ABSTRACT

A memory device that uses a dynamic cell plate sensing scheme. The memory device includes an array of word lines and complementary bit line/plate line pairs. A number of memory cells are located at the intersection of selected word lines and bit line/plate line pairs. A sense amplifier is coupled to the complementary bit line/plate line pairs. The memory device also includes an equilibrate circuit that ac equilibrates a complementary bit line/plate line pair at an equilibration voltage between high and low logic levels prior to reading data. The equilibration voltage and the high and low logic levels for the memory cell are chosen such that a fluctuation in the voltage on one of the plate lines does not corrupt data stored in unaccessed memory cells coupled to the same plate line.

36 Claims, 6 Drawing Sheets

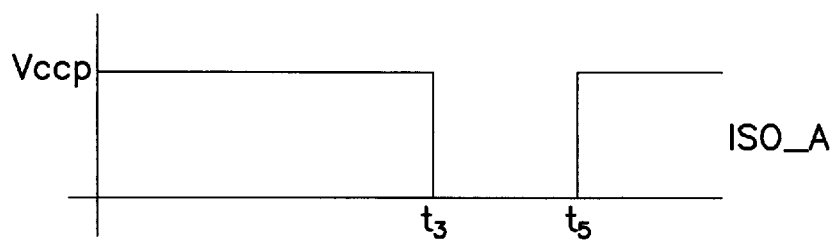
FIG. 6A  ISO_A
FIG. 6B  ISO_B
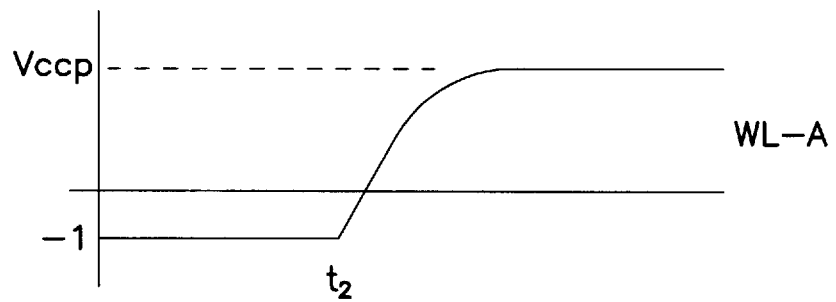
FIG. 6C  WL-A
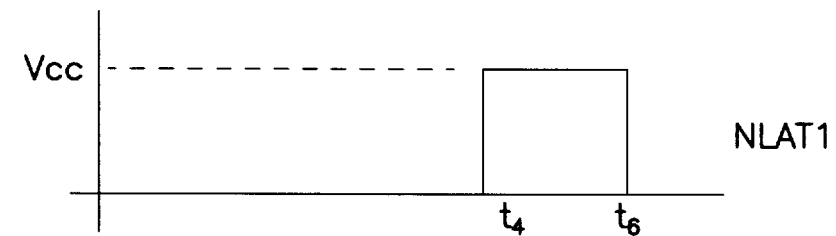
FIG. 6D  NLAT1
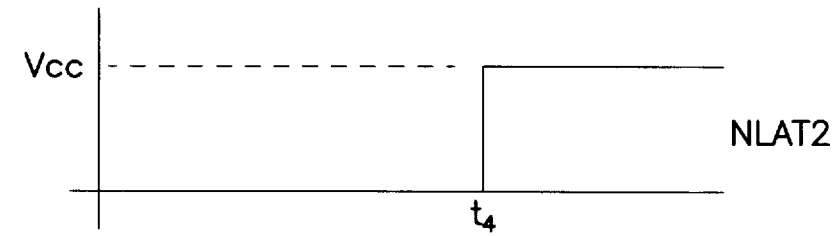
FIG. 6E  NLAT2

METHOD AND MEMORY DEVICE FOR DYNAMIC CELL PLATE SENSING WITH AC EQUILIBRATE

TECHNICAL FIELD OF THE INVENTION

The present invention relates generally to the field of electronic circuits and, in particular, to a method and memory device for dynamic cell plate sensing with ac equilibrate.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. Each memory cell includes a capacitor that stores the data in the cell and a transistor that controls access to the data. The capacitor includes two conductive plates. One plate of each capacitor is typically coupled to a common node with a plate of each of the other capacitors. This plate is referred to as the "cell plate." The charge stored across the capacitor is representative of a data bit and can be either a high voltage or a low voltage.

Typically, the cells of a DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

To read data out of a cell, the capacitor of a cell is accessed by selecting the word line associated with the cell. A complimentary bit line that is paired with the bit line for the selected cell is equilibrated with the voltage on the bit line for the selected cell. When the word line is activated for the selected cell, the capacitor of the selected cell discharges the stored voltage onto the bit line, thus changing the voltage on the bit line. A sense amplifier detects and amplifies the difference in voltage on the pair of bit lines. An input/output device for the array, typically an n-channel transistor, passes the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Recently, researchers have proposed a new architecture for sensing the voltage stored in the cells of a memory device that is aimed at increasing the voltage differential of the bit line pair. According to this new architecture, the cell plate is divided into a number of lines that are each paired with a bit line. The bit line/plate line pairs are coupled to sense amplifiers which read and write data to and from the cells. One problem with this architecture is the difficulty in equilibrating the bit line/plate line pairs when reading data out of a cell without destroying data stored in other cells on the same plate line since the voltage on the plate line is allowed to fluctuate.

For the reasons stated above, and for other reasons stated below which will become apparent to those skilled in the art upon reading and understanding the present specification, there is a need in the art for a memory device that implements a dynamic cell plate sensing scheme with ac equilibration wherein data is not corrupted during a read operation.

SUMMARY OF THE INVENTION

The above mentioned problems with memory devices and other problems are addressed by the present invention and which will be understood by reading and studying the following specification. A method and memory device for a dynamic cell plate sensing scheme is described which uses ac equilibration of bit line/plate line pairs wherein the high, low and equilibration voltage levels are chosen such that data stored in cells on a bit line/plate line par are not corrupted when another cell on the bit line/plate line pair is accessed.

In particular, an illustrative embodiment of the present invention includes a memory device with an array of word lines and complementary bit line/plate line pairs. A number of memory cells are located at the intersection of selected word lines and bit line/plate line pairs. A sense amplifier is coupled to the complementary bit line/plate line pairs. The memory device further includes an equilibrate circuit that ac equilibrates a complementary bit line/plate line pair at an equilibration voltage between high and low logic levels prior to reading data. The equilibration voltage and the high and low logic levels for the memory cell are chosen such that a fluctuation in the voltage on one of the plate lines does not corrupt data stored in unaccessed memory cells that are coupled to the same plate line. In another embodiment, the voltage swing on the sense amplifier is greater than the voltage swing on the bit line/plate line pair between low and high logic levels. In another embodiment, p-channel isolation transistors are included to couple the bit line and plate line to the sense amplifier so as to limit the voltage swing on the bit line/plate line pairs. In another embodiment, a write-assist circuit is coupled between a bit line and a plate line and is coupled to the sense amplifier so as to decrease the time for writing a low logic level back to one of the bit and plate lines. In another embodiment, the sense amplifier includes an n-sense amplifier and a p-sense amplifier. A reference voltage source is coupled to the n-sense amplifier such that the n-sense amplifier drives one of the bit and plate lines to a reference voltage which reference voltage corresponds to the low logic level for the memory cells. In another embodiment, the p-sense amplifier is coupled to a reference voltage that is above the voltage of a supply voltage for the memory device so as to provide sufficient voltage range to drive the sense amplifier.

In another embodiment, an apparatus that includes an electronic system and a memory device is provided. The memory device uses dynamic cell plate sensing with ac equilibration of bit line/plate line pairs. The high, low and equilibration voltage levels are chosen such that data stored in cells on a bit line/plate line pair are not corrupted when another cell on the bit line/plate line pair is accessed.

In another embodiment, a method for storing data in a selected memory cell of a memory device that uses dynamic cell plate sensing with ac equilibration. Data is latched in a sense amplifier of the memory device is provided. The method converts logic levels of the data in the sense amplifier to different logic levels for the memory cells. The method further stores the data in the selected cell. The logic levels for the memory cells are selected such that data in unaccessed cells that share the same plate line with the accessed cell are not corrupted. Further the logic levels are selected such that the bit line/plate line pairs are equilibrated with ac equilibration without corrupting data.

In another embodiment, a method for reading and writing data in a memory device using a dynamic cell plate sensing scheme is provided. The method provides for equilibrating bit line/plate line pairs of the memory device with an ac equilibration. Further, the method provides swinging first and second nodes of a sense amplifier through a first voltage range so as to latch data for reading from or writing to a cell of the memory device. Finally, the method provides for swinging bit line/plate line pairs through a second voltage range, different from the first voltage range such that data of cells that share a bit line/plate line pair are not corrupted when another cell is accessed.

BRIEF DESCRIPTION OF THE DRAWINGS

FIGS. 6A through 6E are timing diagrams that illustrate voltage levels for signals used with the embodiment of FIG. 5.

DETAILED DESCRIPTION OF THE INVENTION

In the following detailed description of the illustrative embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high, however, an asterisk (*) following the signal name in this application indicates that the signal is negative or inverse logic. Negative or inverse logic is considered active when the signal is low.

Figure 1:
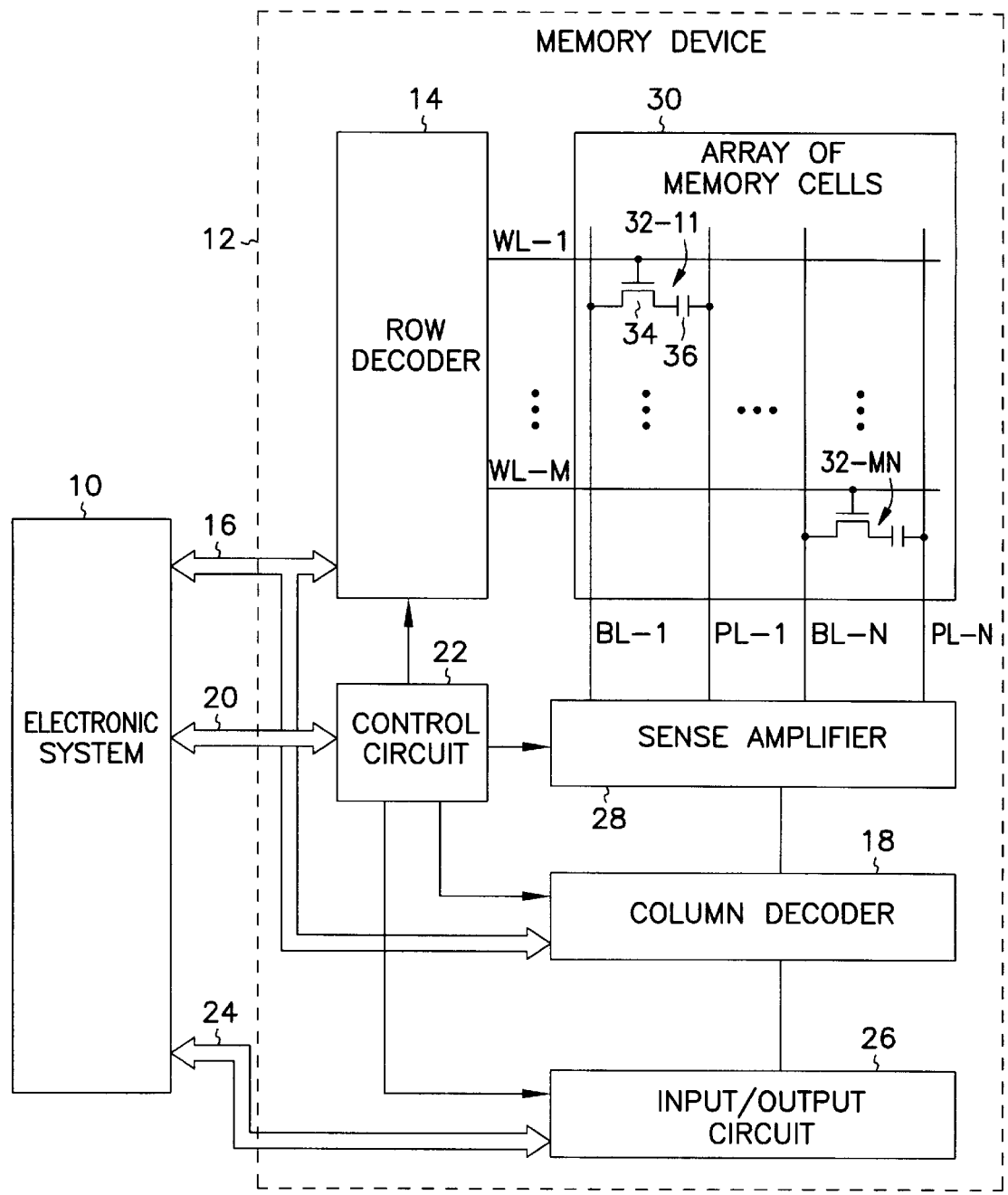
FIG. 1 is a block diagram of an embodiment of a memory device that uses dynamic cell plate sensing according to the teachings.

FIG. 1 is a block diagram of an illustrative embodiment of the present invention. Electronic system 10 is coupled to memory device 12. Electronic system 10 comprises, for example, a microprocessor, memory controller, a chip set or other appropriate system that stores data in a memory device. Electronic system 10 is coupled to row decoder 14 of memory device 12 through address lines 16. Address lines 16 also couple electronic system 10 to column decoder 18. Control lines 20 couple electronic system 10 to control circuit 22. Finally, input/output lines 24 couple electronic system 10 to input/output circuit 26.

Memory device 12 further includes sense amplifier 28 and array of memory cells 30. Array of memory cells 30 includes a number of word lines, WL-1 through WL-M, a number of bit lines, BL-1 through BL-N, and a number of plate lines, PL-1 through PL-N. Array of memory cells 30 is constructed so as to use a dynamic cell plate sensing scheme wherein each bit line, BL-i, is associated with a plate line, PL-i, to be used in reading and writing data into a memory cell. To this end, bit lines BL-1 through BL-N and plate lines PL-1 through PL-N are coupled in complementary pairs (referred to as "bit line/plate line pairs") to sense amplifier 28. Further, word lines WL-1 through WL-M are coupled to row decoder 14.

Memory device 12 is controlled by control circuit 22. Control circuit 22 is coupled to row decoder 14, sense amplifier 28, column decoder 18, and input/output circuit 26.

Array of memory cells 30 includes a number of memory cells 32-11 . . . 32-MN. Memory cell 32-11 is described herein by way of example. It is understood that the remaining memory cells are constructed in similar fashion.

Memory cell 32-11 includes access transistor 34 and capacitor 36. Access transistor 34 includes a gate that is coupled to word line WL-1, a first source/drain region that is coupled to bit line BL-1 and a second source/drain region that is coupled to a first plate of capacitor 36. Plate line PL-1 forms the second plate of capacitor 36.

In operation, memory device 12 reads and writes data for electronic system 10. For example, to read the value from memory cell 32-11, electronic system 10 provides the address of memory cell 32-11 to row decoder 14 over address lines 16. Electronic system 10 also provides control signals to control circuit 22 over control lines 20. Control circuit 22 provides signals to sense amplifier 28 that causes an equilibrate circuit of sense amplifier 28 to equilibrate the voltages on bit line BL-1 and plate line PL-1. The equilibrate circuit of sense amplifier 28 forces bit line BL-1 and plate line PL-1 to a common voltage, e.g., approximately halfway between the high and low logic values for array of memory cells 30. It is noted that the range in voltage between high and low logic levels for sense amplifier 28 differs from the range of memory cell 32-11. The advantages of this equilibrate procedure are described below with respect to FIG. 2.

Row decoder 14 selectively drives word line WL-1 to a high logic level to activate access transistor 34. When the voltage on word line WL-1 is a threshold voltage, $V_t$, above the equilibrate voltage level, a charge stored on capacitor 36 is shared with bit line BL-1. For example, if a high logic level is stored on capacitor 36, the voltage on bit line BL-1 increases. Additionally, by using plate lines in this manner, activation of access transistor 34 also changes the voltage on plate line PL-1 by an amount approximately equal in magnitude to the change on bit line BL-1, but opposite in direction. With the charge on the bit line/plate line pair, sense amplifier 28 next detects the logic state of cell 32-11. Column decoder 18 receives the column address of the selected cell from electronic system 10. Column decoder 18 identifies the appropriate bit line/plate line pair for sense amplifier 28 to use in reading the value from memory cell 32-11. Sense amplifier 28 senses and amplifies the difference in voltage in the bit line/plate line pair and thus produces high and low logic levels on complementary nodes of sense amplifier 28 that correspond to the sensed bit line and plate line, respectively. These voltage levels are passed to electronic system 10 through input/output circuit 26 over input/output lines 24.

In a write operation, electronic system 10 provides data to be written to, for example, memory cell 32-11 over input/output lines 24 to input/output circuit 26. Column decoder 18 receives the column address from electronic system 10 over address lines 16 to select the appropriate bit line/plate line pair for the selected memory cell. Sense amplifier 28, under the control of control circuit 22, forces the bit line/plate line pair for memory cell 32-11 to complementary high and low logic levels based on the data to be stored in memory cell 32-11. Row decoder 14 receives an address from electronic system 10 over address line 16 that indicates the appropriate word line to activate for this storage operation. When word line WL-1 is activated, access transistor 34 causes the data on bit line BL-1 and plate line PL-1 to be stored on capacitor 36. In this process, the high and low logic levels for sense amplifier 28 are translated to appropriate voltage levels for memory cell 32-11.

A technical advantage of the present invention is the equilibration of bit line/plate line pairs at a voltage level between high and low logic levels that prevents the access transistor of a cell from inadvertently leaking voltage from the capacitor as the voltage on the plate line varies when other cells that share the same plate line are accessed.

Figure 2:
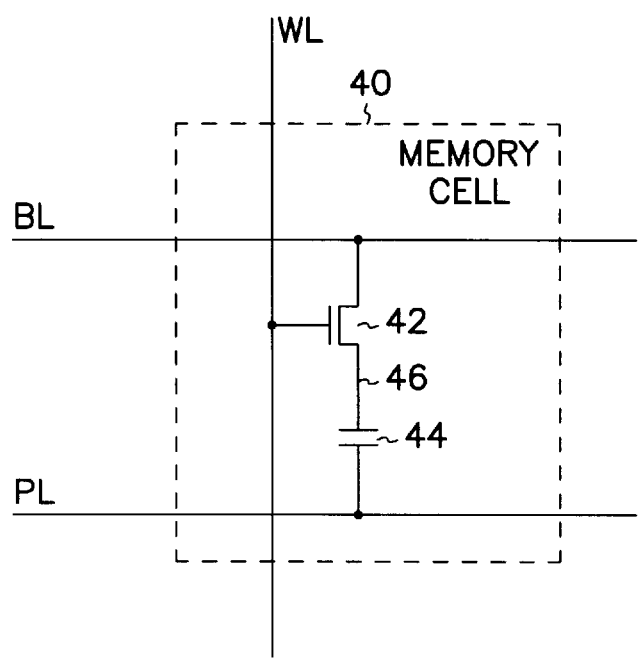
FIG. 2 is a schematic diagram of a memory cell for use in the memory device of FIG. 1.

FIG. 2 is a schematic diagram of an embodiment of a memory cell, indicated generally at 40, according to the teachings of the present invention. In this example, the logic levels for cell 40 are set such that 2 volts is a high logic level and 1 volt is a low logic level assuming a 2 volt power supply ($V_{CC}$) used for the memory device. Further, the bit and plate lines will be equilibrated to a voltage of approximately 1.5 volts which is halfway between the high and low logic levels. This is in contrast to the conventional use of the power supply, $V_{CC}$, for high logic level and ground for low logic level. It is understood that these voltage levels are given by way of example and not by way of limitation. Other appropriate logic levels can be substituted without departing from the spirit and scope of the present invention.

Memory cell 40 includes access transistor 42 and capacitor 44. Access transistor 42 includes a gate that is coupled to word line WL, a first source/drain region that is coupled to bit line BL and a second source/drain region that is coupled to a plate of capacitor 44 at node 46. Plate line PL forms the second plate of capacitor 44.

The operation of memory cell 40 is described to demonstrate the advantage of using ac equilibration according to the teachings of the present invention. Initially, a voltage corresponding to a low logic level is stored in capacitor 44. To accomplish this, the voltage on bit line BL is brought to 1 volt and plate line PL is brought to 2 volts by a sense amplifier (not shown). Word line WL is activated such that transistor 42 forces node 46 to a 1 volt level, a low logic level. After the initial storage of the low logic level on capacitor 44, the bit line BL and plate line PL are equilibrated to the equilibration voltage of 1.5 volts each, e.g., during Row Address Strobe (RAS*) precharge time (tRP). Thus, node 46 reduces from 1 volt to 0.5 volts to maintain the 1 volt difference on capacitor 44. Now, assuming that a high logic level is read from another memory cell that is also coupled to bit line BL and plate line PL, bit line BL is raised to 2 volts and plate line PL is reduced to 1 volt. In memory cell 40, the voltage at node 46 is reduced to ground potential to maintain the 1 volt difference across capacitor 44. At this voltage level, transistor 42 will not turn on (assuming that word line WL is grounded when not active). If, however, node 46 is allowed to drop below ground, it could inadvertently affect the voltage on capacitor 44. Thus, by appropriate selection of the equilibration and high and low logic levels, the voltage at node 46 of memory cell 40 is assured of staying at a voltage level that will not inadvertently turn on transistor 42 and thus avoid corrupting the data stored on capacitor 44 when another memory cell using the same bit line BL and plate line PL is accessed. Generally, the high logic level should be twice the low logic level if the equilibration voltage is halfway between high and low logic levels.

It is noted that the reduced voltage swing on the bit line BL and plate line PL could affect the speed and operation of a sense amplifier coupled to the bit line BL and plate line PL pair. To improve the speed of operation of the sense amplifier, the sense amplifier can be constructed so as to have a voltage swing between high and low logic levels that differs from the voltage swing on the bit line/plate line pair. Several embodiments of the present invention that accomplish this different voltage swing in the sense amplifier and the memory cell are described below.

Figure 3:
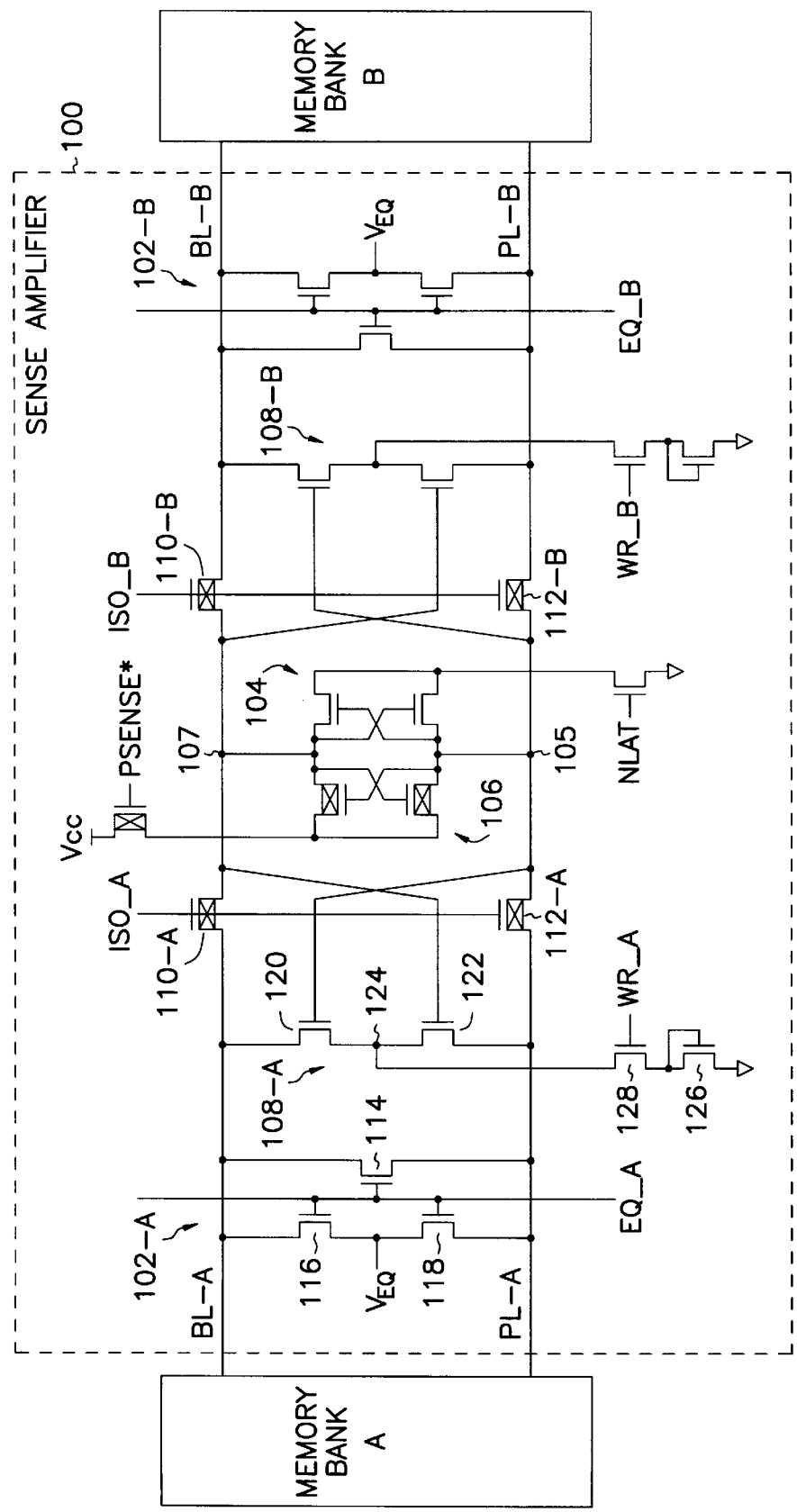
FIG. 3 is a schematic diagram of an embodiment of a sense amplifier for a memory device.

FIG. 3 is a schematic diagram of a sense amplifier, indicated generally at 100, that is coupled between memory bank A and memory bank B. Sense amplifier 100 is coupled to bit line BL-A and plate line PL-A pair at memory bank A and to bit line BL-B and plate line PL-B pair at memory bank B. Sense amplifier 100 includes first and second equilibration circuits 102-A and 102-B, n-sense amplifier 104 and p-sense amplifier 106. Sense amplifier 100 also includes first and second write-assist circuits 108-A and 108-B. It is noted that write-assist circuits 108-A and 108-B are not required but, as described below, are helpful in writing back a voltage to the low bit or plate line. Finally, p-channel isolation transistors 110-A and 110-B couple bit lines BL-A and BL-B to node 107, respectively, and p-channel isolation transistors 112-A and 112-B couple plate lines PL-A and PL-B to node 105, respectively.

Equilibration circuit 102-A includes transistor 114 with a first source/drain region coupled to bit line BL-A, a second source/drain region coupled to plate line PL-A and a gate coupled to receive an equilibration signal labeled EQ_A. Equilibration circuit 102-A further includes first and second transistors 116 and 118. Transistor 116 includes a first source/drain region that is coupled to bit line BL-A, a gate that is coupled to receive the equilibration signal, EQ_A, and a second source/drain region that is coupled to receive an equilibration voltage, $V_{EQ}$. Second transistor 118 includes a first source/drain region that is coupled to plate line PL-A, a gate that is coupled to receive the equilibration signal, EQ_A and a second source/drain region that is coupled to the voltage $V_{EQ}$. When the EQ_A signal is at a high logic level, equilibration circuit 102-A effectively shorts bit line BL-A to plate line PL-A such that both lines are equilibrated to the voltage $V_{EQ}$. Equilibration circuit 102-B is constructed in a similar manner to equilibration circuit 102-A and operates when the EQ_B signal is at a high logic level.

Sense amplifiers 104 and 106 comprise conventional n-sense and p-sense amplifiers constructed from n-channel transistors and p-channel transistors in cross-coupled configurations, respectively.

Write-assist circuit 108-A includes first and second n-channel transistors 120 and 122. Transistor 120 includes a first source/drain region that is coupled to bit line BL-A, a gate that is coupled to node 105 and a second source/drain region that is coupled to a node 124. Transistor 122 includes a first source/drain region that is coupled to plate line PL-A, a gate that is coupled to node 107 and a second source/drain region that is coupled to node 124 in common with transistor 120. Further, write-assist circuit 108-A includes transistor 126 that is coupled in a diode configuration with a gate coupled to a first source/drain region and a second source/drain region coupled to ground. The first source/drain region of transistor 126 is coupled to a first source/drain region of transistor 128. Transistor 128 further includes a second source/drain region that is coupled to node 124 in common with transistors 120 and 122. Further, transistor 128 receives a control signal labeled WR__A at its gate. Write-assist circuit 108-B is constructed in a similar manner to write-assist circuit 108-A and operates when data is written back to memory bank B.

In operation, sense amplifier 100 is used to read and write data to and from memory bank A or memory bank B using a dynamic cell plate sensing scheme with ac equilibration. This embodiment uses a voltage swing on the bit line and plate line at the memory bank that is different from the voltage swing of the sense amplifier. In other words, the values selected for the high and low logic levels on the bit line/plate line pair are different from the voltage swing of sense amplifiers 104 and 106. This allows the bit line/plate line pairs to be equilibrated at a voltage that reduces the power consumption of the memory device and also allows the sense amplifier a sufficient voltage swing in order to operate properly.

When data is read out of, for example, a cell of memory bank A, the gates of isolation transistors 110-B and 112-B are brought to a high voltage level so as to isolate memory bank B from sense amplifiers 104 and 106. Further, the ISO__A signal at the gates of isolation transistor 110-A and 112-A is brought to a low logic level to couple bit line BL-A to node 107 and plate line PL-A to node 105. Equilibration circuit 102-A is deactivated from bit line BL-A and plate line PL-A by lowering EQ__A to a low logic level. Subsequently, a word line in memory bank A for the selected cell is brought to a high potential so as to share charge from a capacitor of the cell with bit line BL-A. Assuming a high logic level is stored, the voltage on bit line BL-A rises and the voltage on plate line PL-A lowers by a corresponding amount. Isolation transistors 110-A and 112-A transmit these voltages on bit line BL-A and plate line PL-A, respectively, to nodes 107 and 105 of sense amplifiers 104 and 106. N-sense amplifier 104 forces the voltage at node 105 to ground potential upon activation of the signal labeled NLAT. Additionally, p-sense amplifier 106 drives the voltage at node 107 to the power supply voltage in response to the signal labeled PSENSE*. Thus, sense amplifier 100 reads out a high logic value from the selected cell of memory bank A.

When data is written back into, for example, memory bank A, a p-channel isolation device 110-A or 112-A translates the ground potential at node 105 or 107 to a voltage of approximately 1 volt on the corresponding bit or plate line. Thus, use of p-channel isolation transistors 110-A and 112-A allows sense amplifiers 104 and 106 to use a higher voltage swing than bit line BL-A and plate line PL-A. This in turn allows the bit line BL-A and plate line PL-A to be equilibrated to a voltage between the new high and low logic levels for the memory bank and reduce power consumption.

A farther advantage of this embodiment is that it allows the memory device to operate at lower power supply voltages. This is due to the fact that the equilibration voltage is used to initially drive n-sense amplifier 104. The equilibration voltage needs to be high enough to overcome the threshold voltage of the transistors of an n-sense amplifier in order to turn it on. In a conventional DRAM, the equilibration voltage is a function of the high logic level and thus the high logic level (power supply voltage) can only be reduced so far before it produces an insufficient equilibration voltage for driving the sense amplifier. In this embodiment, the effect of lowering the high logic level (the power supply voltage) on the equilibration voltage is tempered by the increase in the low logic level produced by the p-channel isolation transistors. Thus, for a given decrease in power supply voltage, the embodiment will provide a higher equilibration voltage for n-sense amplifier 104 and the embodiment can therefore be used with lower power supply voltages than conventional DRAMs.

When opposite data is written back into memory bank A, sense amplifiers 104 and 106 must switch states and drive the previously high node 105 or 107 to a low logic level, e.g., ground, and the low node 105 or 107 to a high logic level, e.g., $V_{CC}$. Continuing the example, assume a low logic value is to be stored in the cell of memory bank A. As the voltage on node 107 approaches ground, isolation transistor 110-A experiences reduced drive current and thus slowly drives bit line BL-A to the desired low logic level, e.g., 1 volt. In order to improve the speed at which bit line BL-A moves to an appropriate low voltage level, sense amplifier 100 includes write-assist circuit 108-A. The voltage at node 105 moves toward $V_{CC}$. This voltage is applied to the gate of transistor 120 which turns on and passes the voltage generated by transistors 126 and 128 to the bit line BL-A. Essentially transistors 128 and 126 are fabricated to form, for example, a 1 volt power supply. Due to the use of n-channel transistors in this write-assist circuit 108-A, the speed at which the bit line BL-A is reduced to the desired 1 volt is increased. Thus, sense amplifier 100 advantageously uses p-channel transistors 110-A, 110-B, 112-A, and 112-B to provide a differential between the swing in voltage on nodes 105 and 107 and the swing in voltage on plate line PL-A and bit line BL-A. Sense amplifier 100 further advantageously increases the speed at which opposite data is written back to the memory bank by including write-assist circuit 108-A to assist with writing back the low logic value to plate line PL-A or bit line BL-A. Write assist circuit 108-B provides the same advantage for memory bank B.

Figure 4:
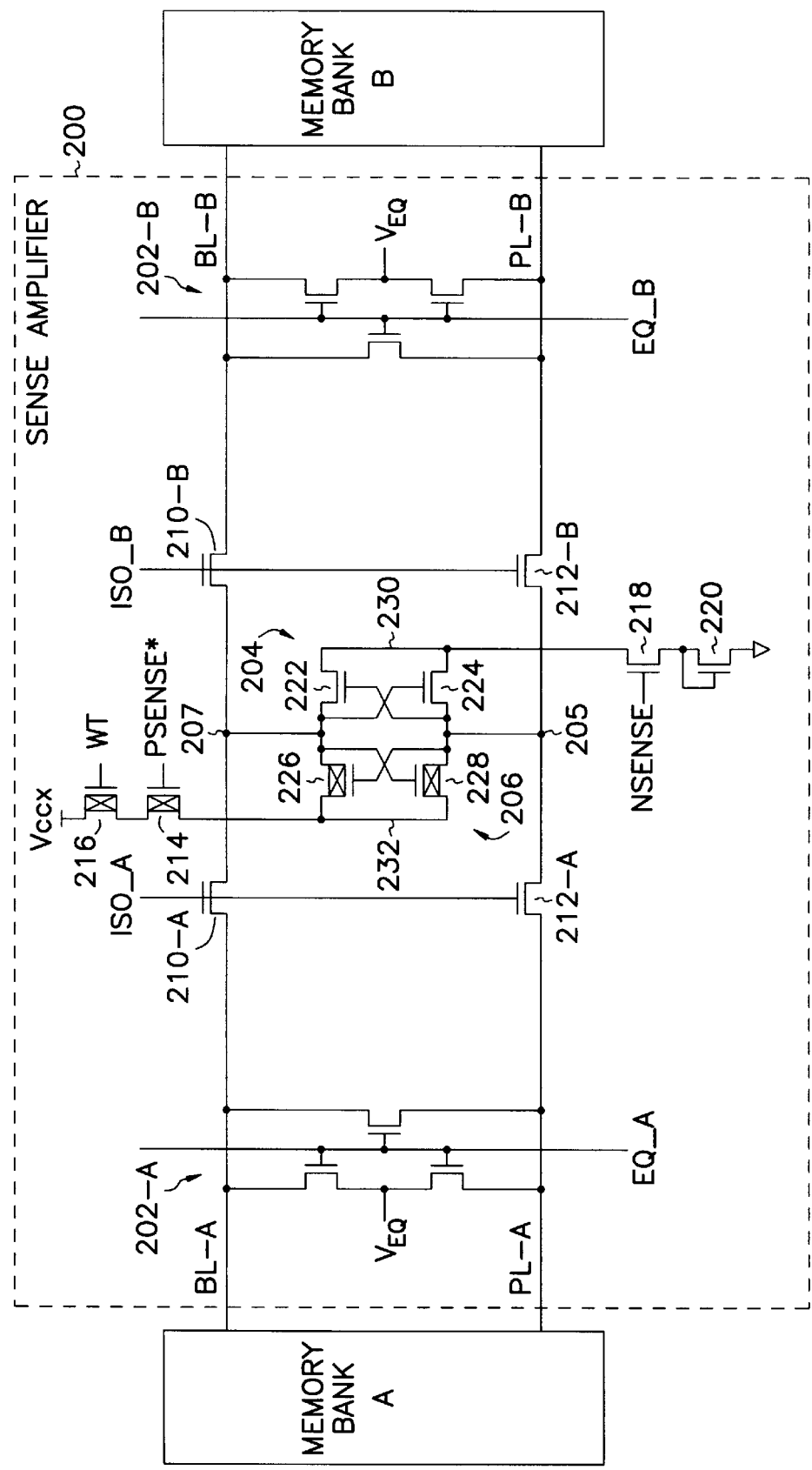
FIG. 4 is a schematic diagram of another embodiment of a sense amplifier for a memory device.

FIG. 4 is a schematic diagram of another embodiment of a sense amplifier, indicated generally at 200, and constructed according to the teachings of the present invention. Sense amplifier 200 is coupled between memory banks A and B. Sense amplifier 200 includes first and second equilibration circuits 202-A and 202-B which are associated with memory banks A and B, respectively. Sense amplifier 200 further includes isolation transistors 210-A and 210-B that couple bit lines BL-A and BL-B, respectively, to node 207. Further, sense amplifier 200 includes additional isolation transistors 212-A and 212-B which couple plate lines PL-A and PL-B, respectively, to node 205. Isolation transistors 210-A, 210-B, 212-A, and 212-B allow memory bank A and memory bank B to share common circuitry. Sense amplifier 200 further includes n-sense amplifier 204 and p-sense amplifier 206. N-sense amplifier 204 includes first and second n-channel transistors 222 and 224 coupled in a cross-coupled configuration. P-sense amplifier 206 includes first and second p-channel transistors 226 and 228 coupled in a cross-coupled configuration.

N-sense amplifier 204 is activated by a signal generated by n-channel transistors 218 and 220. Transistor 218 includes a first source/drain region that is coupled to node 230 of n-sense amplifier 204. Transistor 218 further includes a gate that is coupled to receive a control signal labeled NSENSE. Transistor 220 includes a first source/drain region that is coupled to ground. Additionally, a second source/drain region of transistor 220 is coupled to a gate of transistor 220 and a second source/drain region of transistor 218. Thus, transistor 220 is coupled in a diode configuration and provides a fixed voltage reference of, for example, 1 volt.

P-sense amplifier 206 is activated by a signal generated by transistors 214 and 216. Transistor 214 includes a first source/drain region that is coupled to node 232 of p-sense amplifier 206. Transistor 214 farther includes a gate that is coupled to receive a control signal labeled PSENSE*. Transistor 216 includes a first source/drain region that is coupled to a pumped power supply labeled $V_{CCX}$ that is above the power supply voltage, $V_{CC}$, by at least a threshold voltage of isolation transistor 210-A. Additionally, a second source/drain region of transistor 216 is coupled to a first source/drain region of transistor 214. Transistor 216 also receives a signal, WT, which provides the voltage $V_{CCX}$ to the transistor 214.

By using n-channel transistors as the isolation transistors in this embodiment, p-sense amplifier 206 can drive nodes 205 or 207 to a charged voltage value, e.g., $V_{CCX}$, and the isolation transistors will only pass a value of $V_{CC}$ to the appropriate bit line or plate line as a high logic value. Further, transistors 218 and 220 combine with n-sense amplifier 204 so as to pull down either node 205 or 207 to a voltage of approximately 1 volt. The isolation transistors pass this voltage level to the bit line or plate line as the low logic value for the memory cells. Thus, the sense amplifier is able to have sufficient voltage swing (e.g., from 1 volt to $V_{CCX}$) in order to operate properly and the bit line/plate line pairs are able to operate at a reduced voltage swing (e.g., from 1 volt to $V_{CC}$) so as to allow dynamic cell plate sensing to be used with ac equilibration.

In operation, sense amplifier 200 is used to read and write data to and from memory bank A or memory bank B using a dynamic cell plate sensing scheme. When data is read out of, for example, a cell of memory bank A, the ISO_B signal at the gates of isolation transistors 210-B and 212-B is brought to a low voltage level so as to isolate memory bank B from sense amplifiers 204 and 206. Further, the ISO_A signal at the gates of isolation transistors 210-A and 212-A is brought to a high logic level to couple bit line BL-A to node 207 and plate line PL-A to node 205. Equilibration circuit 202-A is deactivated from bit line BL-A and plate line PL-A by lowering EQ_A to a low logic level. Subsequently, a word line in memory bank A for the selected cell is brought to a high potential so as to share charge from a capacitor of the cell with bit line BL-A. Assuming a high level is stored in the cell, the voltage on bit line BL-A rises and the voltage on plate line PL-A lowers by a corresponding amount. Isolation transistors 210-A and 212-A transmit these voltages on bit line BL-A and plate line PL-A, respectively, to nodes 207 and 205 of sense amplifiers 204 and 206.

N-sense amplifier 204 forces the voltage at node 205 to a voltage of approximately 1 volt upon activation of the signal labeled NSENSE. As the voltage between node 230 and node 207 approaches a threshold voltage, $V_t$, transistor 224 begins to conduct. Conduction results in the discharge of the low voltage node toward the voltage established by transistors 218 and 220. In our example, this voltage is approximately 1 volt. Ultimately, node 230 will reach the 1 volt level, bringing node 205 with it. Note that transistor 222 will not conduct since its gate voltage derives from node 205, which is discharging toward 1 volt.

Shortly after n-sense amplifier 204 is activated, signals PSENSE* and WT are driven toward ground. This activates p-sense amplifier 206 that operates in a complementary fashion to n-sense amplifier 204. With node 205 approaching ground, a strong signal exists to drive transistor 226 into conduction. This conduction charges node 207 to a high voltage, $V_{CCX}$.

Data is written back to memory bank A by latching the data with sense amplifiers 204 and 206 from an external source onto nodes 205 and 207. In this process, transistor 216 is turned off momentarily to allow sense amplifiers 204 and 206 to flip logic states. Further, isolation transistors 210-A and 212-A transmit this data to bit line BL-A and plate line PL-A. As mentioned above, the node 205 or 207 that corresponds to the high logic level will be reduced by the isolation transistor down to approximately the power supply voltage $V_{CC}$.

Figure 5:
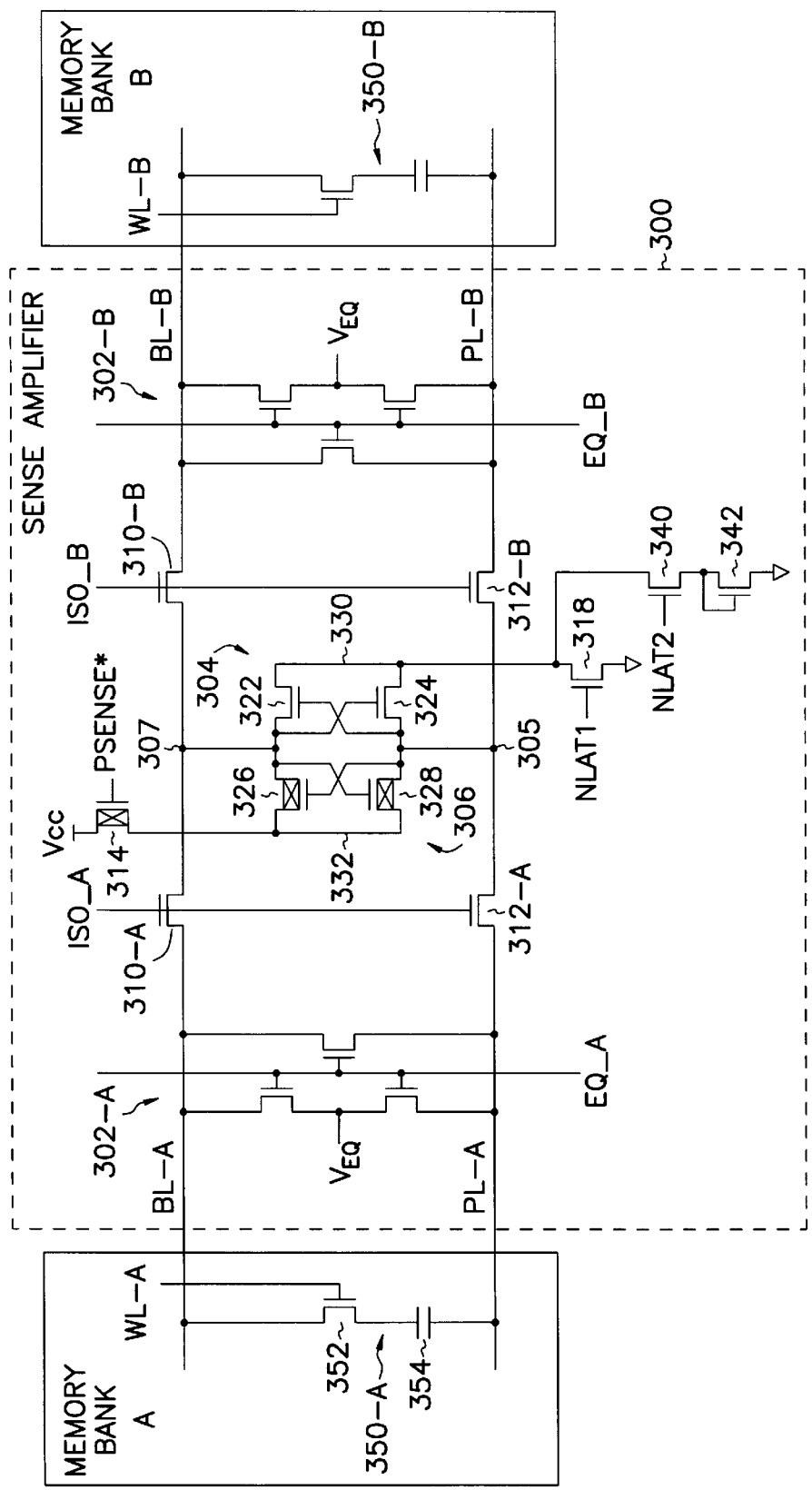
FIG. 5 is a schematic diagram of another embodiment of a sense amplifier for a memory device.

FIG. 5 is a schematic diagram of another illustrative embodiment of the present invention. Sense amplifier 300 is coupled between memory banks A and B. Sense amplifier 300 includes equilibration circuits 302-A and 302-B. Sense amplifier 300 includes first and second isolation transistors 310-A and 310-B that couple bit lines BL-A and BL-B, respectively, to node 307. Additionally, sense amplifier 300 includes n-channel isolation transistors 312-A and 312-B that couple plate line PL-A and PL-B, respectively, to node 305. Further, memory banks A and B share n-sense amplifier 304 and p-sense amplifier 306.

P-sense amplifier 306 includes first and second p-channel transistors 326 and 328 coupled in a conventional cross-coupled configuration. An additional p-channel transistor 314 includes a first source/drain region that is coupled to node 332. Additionally, a second source/drain region of transistor 314 is coupled to a power supply, $V_{CC}$. A gate of transistor 314 is coupled to a control signal PSENSE* that activates p-sense amplifier 306.

N-sense amplifier 304 includes first and second transistors 322 and 324 coupled in a cross-coupled configuration. Additionally, n-sense amplifier 304 includes transistors 318, 340 and 342. Transistor 342 is coupled in a diode configuration so as to provide, for example, approximately a 0.7 volt reference voltage. Transistor 340 includes a first source/drain region that is coupled to a first source/drain region of transistor 342. Additionally, a gate of transistor 340 is coupled to receive a control signal labeled NLAT2. Additionally, a second source/drain region of transistor 340 is coupled to a first source/drain region of transistor 318. A second source/drain region of transistor 318 is coupled to ground and a gate of transistor 318 is coupled to receive a control signal labeled NLAT1. The first source/drain region of transistor 318 is also coupled to node 330 in order to drive n-sense amplifier 304.

In operation, n-sense amplifier 300 also provides a voltage swing on the bit line/plate line pair that does not interfere with the data stored in a memory cell when data is read from an adjacent memory cell. In this scheme, a high logic value corresponds to a power supply voltage of 2 volts. Additionally, a low logic value on a bit line/plate line corresponds to approximately 0.7 volts. Thus, the equilibration voltage is selected to be approximately 1.35 volts which is centered between the high and low logic values.

In this embodiment, it is possible for node 350-A or 350-B to be reduced down to –0.6 volts. Thus, in order to prevent corruption of the data stored in a memory cell, word lines WL are biased at –1 volts when off.

Further, transistors 318, 340 and 342 are used in order to establish appropriate voltages on the bit line/plate line pairs as well as to assure a proper voltage swing in sense amplifier 300. The manner in which this is accomplished is described in conjunction with FIGS. 6A through 6E. Initially, at time $t_1$, the voltage on isolation transistor 310-B and 312-B is reduced to ground, thus isolating sense amplifier 300 from memory bank B. At time $t_2$, the word line of the selected cell for memory bank A is brought to a high voltage level in order to activate transistor 352. Capacitor 354 thus shares charge with bit line BL, for example, when a high logic value is stored in the selected memory cell. Also, the voltage on plate line PL is reduced by a corresponding amount.

At time $t_3$, the signal ISO_A is reduced to a low logic level thus isolating the sense amplifier from bit line BL-A and plate line PL-A. At time $t_4$, NLAT1 and NLAT2 control signals provided to transistors 318 and 340, respectively, are brought to a high voltage value in order to activate the n-sense amplifier 304. N-sense amplifier 304 thus drives the low voltage node, in this case node 305, toward ground. By including transistor 318 and control signal NLAT1, this initial voltage swing on the sense amplifier is between $V_{CC}$ and ground which provides sufficient drive for n-sense amplifier 304. At time $t_5$, the control signal ISO_A returns to a high logic value thus reconnecting bit line BL-A and plate line PL-A to nodes 307 and 305, respectively. With the bit line and plate line reinstated, the NLAT1 signal returns to a ground potential at time $t_6$. Thus, from time $t_6$ forward, n-sense amplifier 304 is controlled by transistors 340 and 342 which impose an approximately 0.7 volt level on node 305 and thus on plate line PL-A. Thus, in this manner, sense amplifier 300 provides sufficient voltage swing in sense amplifier 300 in order to adequately latch the data. It also provides appropriate voltage levels on the bit line and plate lines in order to allow dynamic sensing without corrupting data.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the high and low logic values selected for the bit line/plate line pairs may be varied from the specified 1 and 2 volt levels. For example, in a 3 volt part, high and low logic levels may be selected at 3 volts and 1.5 volts with an equilibration voltage of 2.25 volts. Similarly, other voltages may be selected as appropriate. Further, equilibration circuits shown in the various embodiments are shown by way of example. Other equilibration circuits that effectively short the bit line and plate line together may be substituted. Further, the teachings of the present invention are not limited to use with a shared sense amplifier.

What is claimed is:

1. A memory device, comprising:
   addressing circuitry;
   an array of word lines and complementary bit line/plate line pairs coupled to the addressing circuitry;
   a number of memory cells located at the intersection of selected word lines and bit line/plate line pairs;
   a sense amplifier coupled to the complementary bit line/plate line pairs;
   an equilibration circuit that ac equilibrates a complementary bit line/plate line pair at an equilibration voltage between high and low logic levels of the memory cells prior to reading data; and
   wherein the equilibration voltage and the high and low logic levels for the memory cell are chosen to prevent access transistors for unselected memory cells from turning on when another memory cell on the same plate line is accessed without re-precharging the bit line/plate line pair to a voltage above the equilibration voltage after the access.

2. The memory device of claim 1, wherein the voltage swing on the sense amplifier is greater than the voltage swing on the bit line/plate line pair between low and high logic levels.

3. The memory device of claim 2, and further comprising p-channel isolation transistors that couple the bit line and plate line to the sense amplifier so as to limit the voltage swing on the bit line/plate line pairs.

4. The memory device of claim 3, and further comprising a write-assist circuit coupled between a bit line and a plate line and coupled to the sense amplifier so as to decrease the time for writing a low logic level back to one of the bit and plate lines.

5. The memory device of claim 4, wherein the write assist circuit comprises:
   first and second transistors;
   a first source/drain region of the first and second transistors are coupled together at a common node;
   a second source/drain region of the first transistor is coupled to the plate line;
   a second source/drain region of the second transistor is coupled to the bit line;
   a gate of the first transistor is coupled to a node of the sense amplifier;
   a gate of the second transistor is coupled to a different, complementary node of the sense amplifier; and
   a voltage reference circuit is coupled to the common node of the first and second transistors such that one of the first and second transistors provides the reference voltage to one of the bit and plate lines to assist in writing a low logic level.

6. The memory device of claim 1, wherein the sense amplifier comprises:
   an n-sense amplifier with a first node coupled to the bit line and a second node coupled to the plate line;
   a p-sense amplifier coupled between the first and second nodes of the n-sense amplifier; and
   a reference voltage source coupled to the n-sense amplifier such that the n-sense amplifier drives one of the bit and plate lines to a reference voltage which reference voltage corresponds to the low logic level for the memory cells.

7. The memory device of claim 6, wherein the p-sense amplifier is coupled to a reference voltage that is above the voltage of a supply voltage for the memory device so as to provide sufficient voltage range to drive the sense amplifier.

8. The memory device of claim 6, wherein the reference voltage source comprises:
   a first transistor coupled between a node of the sense amplifier and ground potential;
   a second transistor coupled in a diode configuration so as to provide a reference voltage; and
   a third transistor that couples the second transistor to the node of the sense amplifier;
   wherein a first control signal activates the first transistor so to allow the n-sense amplifier to initially pull one of the bit and plate lines to ground potential and a second control signal activates the second transistor to pull one of the bit and plate lines to a voltage level established by the third transistor to be used as a low logic level for the memory cells.

9. An apparatus, comprising:
   an electronic system; and
   a memory device coupled to the electronic system, wherein the memory device uses dynamic cell plate sensing with ac equilibration of bit line/plate line pairs and wherein the high, low and equilibration voltage levels are chosen to prevent access transistors for unselected memory cells from turning on when another memory cell on the same plate line is accessed without re-precharging the bit line/plate line pair to a voltage above the equilibration voltage after the access.

10. The apparatus of claim 9, wherein the memory device includes p-channel isolation transistors that couple plate lines and bit lines to a sense amplifier so as to allow a larger range of voltages on the sense amplifier than on the bit and plate lines.

11. The apparatus of claim 9, wherein the memory device comprises:
an n-sense amplifier with a first node coupled to a bit line and a second node coupled to a plate line;
a p-sense amplifier coupled between the first and second nodes of the n-sense amplifier; and
a reference voltage source coupled to the n-sense amplifier such that the n-sense amplifier drives one of the bit and plate lines to the reference voltage which reference voltage corresponds to the low logic level for the memory cells.

12. The apparatus of claim 11, wherein the reference voltage source further comprises a second reference voltage which is used initially to drive the n-sense amplifier with a greater voltage swing.

13. The apparatus of claim 11, wherein the p-sense amplifier is coupled to a reference voltage that is above the voltage of a supply voltage for the memory device so as to provide sufficient voltage range to drive the sense amplifier.

14. The apparatus of claim 9, wherein the electronic system comprises a microprocessor.

15. The apparatus of claim 9, wherein the memory device comprises memory cells with high logic levels that are twice the voltage of the low logic level.

16. A method for storing data in a selected memory cell of a memory device that uses dynamic cell plate sensing with ac equilibration, the method comprising the steps of:
latching data in a sense amplifier of the memory device;
converting logic levels of the data in the sense amplifier to different logic levels for the memory cells; and
storing the data in the selected cell wherein the logic levels for the memory cells are selected to prevent access transistors for unselected memory cells from turning on when another memory cell on the same plate line is accessed without re-precharging the bit line/plate line pair to a voltage above the equilibration voltage after the access.

17. The method claim 16, wherein the step of converting logic levels comprises the step of passing the data through a p-channel isolation transistor.

18. The method of claim 17, wherein the step passing the data through a p-channel isolation transistor further comprises the step of assisting the p-channel isolation transistor with a write assist circuit that aides in the transfer of a low logic level to a plate or bit line.

19. The method of claim 16, wherein the step of latching the data with a sense amplifier comprises the step of driving an n-sense amplifier with a voltage level approximately equal to the low logic level for the memory cell and driving a p-sense amplifier with a voltage level that is above the high logic level for the memory cells.

20. The method of claim 16, wherein the step of latching the data with a sense amplifier comprises the step of driving an n-sense amplifier with one reference voltage to latch the data and a second reference voltage to establish the low logic level for the bit and plate lines.

21. A method for reading and writing data in a memory device using a dynamic cell plate sensing scheme, comprising the steps of:

equilibrating bit line/plate line pairs of the memory device with an ac equilibration during a read operation;
swinging first and second nodes of a sense amplifier through a first voltage range so as to latch data for reading from or writing to a cell of the memory device; and
swinging bit line/plate line pairs through a second voltage range, different from the first voltage range to prevent access transistors for unselected memory cells from turning on when another memory cell on the same plate line is accessed without re-precharging the bit line/plate line pair to a voltage above the equilibration voltage after the access.

22. A memory device, comprising:
an addressable array of memory cells coupled to crossing word lines and complementary bit line/plate line pairs;
a sense amplifier coupled to the complementary bit line/plate line pairs;
an equilibration circuit coupled between each complementary bit line/plate line pair that ac equilibrates the complementary bit line/plate line pair prior to a read operation; and
wherein the voltage swing on the sense amplifier is greater than the voltage swing on the complementary bit line/plate line pair between low and high logic levels.

23. The memory device of claim 22, wherein the high logic level for the complementary bit line/plate line pair is approximately two times the low logic level so as to prevent corruption of data of cells on the same plate line as an accessed cell due to fluctuations on the plate line voltage.

24. The memory device of claim 22, wherein the sense amplifier is coupled to the bit line/plate line pairs through p-channel transistors so as to establish tie lower voltage swing for the bit line/plate line pair.

25. The memory device of claim 22, wherein the sense amplifier includes a p-sense amplifier that is driven by a voltage that is greater than the high logic level for the bit line/plate line pair.

26. A memory device, comprising:
addressing circuitry;
an array of word lines and complementary bit line/plate line pairs coupled to the addressing circuitry;
a number of memory cells located at the intersection of selected word lines and bit line/plate line pairs;
a sense amplifier coupled to the complementary bit line/plate line pairs;
an equilibration circuit that ac equilibrates a complementary bit line/plate line pair at an equilibration voltage between high and low logic levels of the memory cells prior to reading data;
wherein the equilibration voltage and the high and low logic levels for the memory cell are chosen such that a fluctuation in voltage on one of the plate lines does not corrupt data stored in unaccessed memory cells that are coupled to the same plate line; and
wherein the voltage swing on the sense amplifier is greater than the voltage swing on the bit line/plate line pair between low and high logic levels.

27. The memory device of claim 26, and further comprising p-channel isolation transistors that couple the bit line and plate line to the sense amplifier so as to limit the voltage swing on the bit line/plate line pairs.

28. The memory device of claim 27, and further comprising a write-assist circuit coupled between a bit line and a plate line-and coupled to the sense amplifier so as to decrease the time for writing a low logic level back to one of the bit and plate lines.

29. The memory device of claim 28, wherein the write assist circuit comprises:

first and second transistors;

a first source/drain region of the first and second transistors are coupled together at a common node;

a second source/drain region of the first transistor is coupled to the plate line;

a second source/drain region of the second transistor is coupled to the bit line;

a gate of the first transistor is coupled to a node of the sense amplifier;

a gate of the second transistor is coupled to a different, complementary node of the sense amplifier; and a voltage reference circuit is coupled to the common node of the first and second transistors such that one of the first and second transistors provides the reference voltage to one of the bit and plate lines to assist in writing a low logic level.

30. A memory device, comprising:

addressing circuitry;

an array of word lines and complementary bit line/plate line pairs coupled to the addressing circuitry;

a number of memory cells located at the intersection of selected word lines and bit line/plate line pairs;

a sense amplifier coupled to the complementary bit line/plate line pairs;

an equilibration circuit that ac equilibrates a complementary bit line/plate line pair at an equilibration voltage between high and low logic levels of the memory cells prior to reading data;

wherein the equilibration voltage and the high and low logic levels for the memory cell are chosen such that a fluctuation in voltage on one of the plate lines does not corrupt data stored in unaccessed memory cells that are coupled to the same plate line;

wherein the sense amplifier comprises:

an n-sense amplifier with a first node coupled to the bit line and a second node coupled to the plate line;

a p-sense amplifier coupled between the first and second nodes of the n-sense amplifier; and a reference voltage source coupled to the n-sense amplifier such that the n-sense amplifier drives one of the bit and plate lines to a reference voltage which reference voltage corresponds to the low logic level for the memory cells; and wherein the p-sense amplifier is coupled to a reference voltage that is above the voltage of a supply voltage for the memory device so as to provide sufficient voltage range to drive the sense amplifier.

31. A memory device, comprising:

addressing circuitry;

an array of word lines and complementary bit line/plate line pairs coupled to the addressing circuitry;

a number of memory cells located at the intersection of selected word lines and bit line/plate line pairs;

a sense amplifier coupled to the complementary bit line/plate line pairs;

an equilibration circuit that ac equilibrates a complementary bit line/plate line pair at an equilibration voltage between high and low logic levels of the memory cells prior to reading data;

wherein the equilibration voltage and the high and low logic levels for the memory cell are chosen such that a fluctuation in voltage on one of the plate lines does not corrupt data stored in unaccessed memory cells that are coupled to the same plate line;

wherein the sense amplifier comprises:

an n-sense amplifier with a first node coupled to the bit line and a second node coupled to the plate line;

a p-sense amplifier coupled between the first and second nodes of the n-sense amplifier; and a reference voltage source coupled to the n-sense amplifier such that the n-sense amplifier drives one of the bit and plate lines to a reference voltage which reference voltage corresponds to the low logic level for the memory cells; and wherein the reference voltage source comprises:

a first transistor coupled between a node of the sense amplifier and ground potential;

a second transistor coupled in a diode configuration so as to provide a reference voltage; and a third transistor that couples the second transistor to the node of the sense amplifier;

wherein a first control signal activates the first transistor so to allow the n-sense amplifier to initially pull one of the bit and plate lines to ground potential and a second control signal activates the second transistor to pull one of the bit and plate lines to a voltage level established by the third transistor to be used as a low logic level for the memory cells.

32. An apparatus, comprising:

an electronic system;

a memory device coupled to the electronic system, wherein the memory device uses dynamic cell plate sensing with ac equilibration of bit line/plate line pairs and wherein the high, low and equilibration voltage levels are chosen such that data stored in cells on a bit line/plate line pair are not corrupted when another cell on the bit line/plate line pair is accessed;

wherein the memory device includes p-channel isolation transistors that couple plate lines and bit lines to a sense amplifier so as to allow a larger range of voltages on the sense amplifier than on the bit and plate lines;

wherein the memory device comprises:

an n-sense amplifier with a first node coupled to a bit line and a second node coupled to a plate line;

a p-sense amplifier coupled between-the first and second nodes of the n-sense amplifier; and a reference voltage source coupled to the n-sense amplifier such that the n-sense amplifier drives one of the bit and plate lines to the reference voltage which reference voltage corresponds to the low logic level for the memory cells.

33. The apparatus of claim 32, wherein the reference voltage source further comprises a second reference voltage which is used initially to drive the n-sense amplifier with a greater voltage swing.

34. The apparatus of claim 32, wherein the p-sense amplifier is coupled to a reference voltage that is above the voltage of a supply voltage for the memory device so as to provide sufficient voltage range to drive the sense amplifier.

35. A method for storing data in a selected memory cell of a memory device that uses dynamic cell plate sensing with ac equilibration, the method comprising the steps of:

latching data in a sense amplifier of the memory device;

converting logic levels of the data in the sense amplifier to different logic levels for the memory cells; and storing the data in the selected cell wherein the logic levels for the memory cells are selected such that data in-unaccessed cells that share the same plate line with the accessed cell are not corrupted and such that bit line/plate line pairs are equilibrated with ac equilibration; and wherein the step of latching the data with a sense amplifier comprises the step of driving an n-sense amplifier with a voltage level approximately equal to the low logic level for the memory cell and driving a p-sense amplifier with a voltage level that is above the high logic level for the memory cells.

36. A method for storing data in a selected memory cell of a memory device that uses dynamic cell plate sensing with ac equilibration, the method comprising the steps of:

latching data in a sense amplifier of the memory device;

converting logic levels of the data in the sense amplifier to different logic levels for the memory cells; and storing the data in the selected cell wherein the logic levels for the memory cells are selected such that data in unaccessed cells that share the same plate line with the accessed cell are not corrupted and such that bit line/plate line pairs are equilibrated with ac equilibration; and wherein the step of latching the data with a sense amplifier comprises the step of driving an n-sense amplifier with one reference voltage to latch the data and a second reference voltage to establish the low logic level for the bit and plate lines.

* * * * *